United States Patent
Zhang et al.

(10) Patent No.: US 11,237,441 B2
(45) Date of Patent: Feb. 1, 2022

(54) ARRAY SUBSTRATE AND MANUFACTURING METHOD THEREOF, DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xinjie Zhang, Beijing (CN); Chengwei Liu, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 332 days.

(21) Appl. No.: 16/326,539

(22) PCT Filed: Jun. 4, 2018

(86) PCT No.: PCT/CN2018/089777
§ 371 (c)(1),
(2) Date: Feb. 19, 2019

(87) PCT Pub. No.: WO2019/047574
PCT Pub. Date: Mar. 14, 2019

(65) Prior Publication Data
US 2020/0401005 A1 Dec. 24, 2020

(30) Foreign Application Priority Data
Sep. 5, 2017 (CN) .......................... 201710791691.5

(51) Int. Cl.
*H01L 21/02* (2006.01)
*G02F 1/1362* (2006.01)
*H01L 27/12* (2006.01)

(52) U.S. Cl.
CPC ...... *G02F 1/136286* (2013.01); *H01L 27/127* (2013.01); *H01L 27/1237* (2013.01)

(58) Field of Classification Search
CPC .. G02F 1/136286; G02F 1/133; G02F 1/1362; G02F 1/1368; H01L 27/1237;
(Continued)

(56) References Cited

U.S. PATENT DOCUMENTS

| 6,654,075 B1 * | 11/2003 | Takeichi | ........... G02F 1/134336 349/43 |
| 2002/0027621 A1 * | 3/2002 | Chae | .................. G02F 1/13458 349/40 |

(Continued)

FOREIGN PATENT DOCUMENTS

| CN | 1737883 A | 2/2006 |
| CN | 100357991 C | 12/2007 |

(Continued)

OTHER PUBLICATIONS

International Search Report and Written Opinion for International Appl. No. PCT/CN2018/089777, dated Sep. 27, 2018.

(Continued)

*Primary Examiner* — Samuel Park
(74) *Attorney, Agent, or Firm* — The Webb Law Firm

(57) ABSTRACT

The present disclosure relates to an array substrate and a manufacturing method thereof, a display device. The manufacturing method of the array substrate includes: upon manufacturing of a gate layer, connecting a gate line in the gate layer with a signal line electrically; and after manufacturing of an active layer is completed, disconnecting electrical connection of the gate line with the signal line.

9 Claims, 7 Drawing Sheets

(58) Field of Classification Search
CPC .............. H01L 27/127; H01L 27/124; H01L 2021/775; H01L 27/1214; H01L 27/3232; H01L 51/0076; H01L 27/14603; H01L 27/14605; H01L 27/14609; H01L 27/14812; H01L 27/3248; H01L 27/32–326; H01L 51/50–5012; H01L 51/525–5287; H01L 2227/32–326; H01L 2251/5323–5361; H01L 2924/12044; H01L 27/12; H01L 27/3262
See application file for complete search history.

(56) References Cited

U.S. PATENT DOCUMENTS

| | | | |
|---|---|---|---|
| 2004/0016925 A1* | 1/2004 | Watamura | H01L 27/124 257/59 |
| 2004/0090406 A1* | 5/2004 | Lin | G02F 1/136209 345/87 |
| 2006/0038175 A1* | 2/2006 | Lai | G02F 1/136259 257/59 |
| 2007/0222936 A1* | 9/2007 | Shih | G02F 1/136286 349/187 |
| 2010/0084657 A1 | 4/2010 | Tseng | |
| 2010/0201608 A1 | 8/2010 | Sakai et al. | |
| 2015/0185513 A1* | 7/2015 | Wu | G02F 1/1368 257/72 |
| 2016/0148954 A1* | 5/2016 | Sun | H01L 29/78672 257/72 |

FOREIGN PATENT DOCUMENTS

| | | | |
|---|---|---|---|
| CN | 103227173 | A | 7/2013 |
| CN | 104658973 | A | 5/2015 |
| CN | 104900633 | A | 9/2015 |
| CN | 105304645 | A | 2/2016 |
| CN | 106206607 | A | 12/2016 |
| CN | 107589606 | A | 1/2018 |

OTHER PUBLICATIONS

First Office Action for CN Appl. No. 201710791691.5, dated Oct. 28, 2019.

* cited by examiner

ARRAY SUBSTRATE AND MANUFACTURING METHOD THEREOF, DISPLAY DEVICE

CROSS-REFERENCE TO RELATED APPLICATIONS

This application is a U.S. National Stage Application under 35 U.S.C. § 371 of International Application No. PCT/CN2018/089777, filed on Jun. 4, 2018, which claims priority to Chinese Patent Application No. 201710791691.5, filed on Sep. 5, 2017, and entitled "Array Substrate and Manufacturing Method thereof, Display Device". The disclosure of each of these applications is incorporated by reference herein in entirety.

TECHNICAL FIELD

The present disclosure relates to an array substrate and a manufacturing method thereof, as well as a display device.

BACKGROUND

At present, with keen competition in the liquid crystal panel industry, panel manufacturers begin to compete in reduction of panel cost and improvement of performance. Adoption of GOA (Gate driver on Array) may reduce the amount of use of ICs (Integrated circuits), and thus become a direct method to reduce the cost, the attempt and adoption of this new structure improves performance and reduces power consumption effectively.

And, in an array substrate manufacturing process, electrostatic breakdown is an important problem of the array substrate at all times. It is necessary to consider reducing electrostatic breakdown as much as possible, in the product design and the manufacturing process.

SUMMARY

According to some embodiments of the present disclosure, there is provided an array substrate manufacturing method comprising: forming a gate layer, the gate layer comprising a gate line and a signal line which are connected electrically; forming an active layer; and disconnecting electrical connection of the gate line with the signal line after forming the active layer.

In some embodiments, forming the gate layer comprises: forming a connection lead between the gate line and the signal line, two ends of the connection lead connect with the gate line and the signal line respectively.

In some embodiments, forming the gate layer comprises manufacturing simultaneously the gate line and the connection lead.

In some embodiments, disconnecting electrical connection of the gate line with the signal line comprises: removing the connection lead.

In some embodiments, the method further comprises: forming a gate insulation layer on the gate layer, wherein forming a gate insulation layer on the gate layer comprises removing a gate insulation material at a corresponding location of the connection lead and exposing the connection lead; and forming the gate insulation layer on the gate insulation layer, wherein forming a source-drain layer on the gate insulation layer comprises removing the connection lead.

In some embodiments, forming a gate insulation layer on the gate layer comprises: forming a gate insulation material film on the gate layer; and forming a pattern of the gate insulation layer by a patterning process, the connection lead being exposed at the location of the pattern corresponding to the connection lead.

In some embodiments, before forming the gate insulation material film, the method further comprises: forming a gate material film; and forming a pattern of the gate layer by a patterning process, the pattern of the gate layer including the connection lead.

In some embodiments, after forming the pattern of the gate layer by the patterning process, the method further comprises: forming an active layer material film; and forming a pattern of the active layer by a patterning process.

In some embodiments, forming a source-drain layer on the gate insulation layer comprises: forming a source-drain material film; and forming a pattern of the source-drain layer by a patterning process, and removing the connection lead.

In some embodiments, after forming the pattern of the source-drain layer, the method further comprises: forming an inter-layer insulation layer; forming a first electrode layer; forming a passivation layer; and forming a second electrode layer.

In some embodiments, the connection lead is not located on a connection path between a gate drive circuit and the gate line.

In some embodiments, The connection path is a linear connection path.

According to some other embodiments of the present disclosure, there is provided an array substrate which is manufactured by adopting the array substrate manufacturing method of any of above embodiments.

According to some other embodiments of the present disclosure, there is provided a display device comprising the array substrate as described before.

DETAILED DESCRIPTION

In order to make goals, technical solutions and advantages of the present disclosure more clear, the present disclosure is further explained in detail in conjunction with specific embodiments and with reference to drawings below.

It is to be noted that, all expressions which use a "first" and a "second" in embodiments of the present disclosure are used to distinguish between two different entities or different parameters with the same name. It can be seen that the "first" and the "second" are only for ease of expression, and should not be understood to limit an embodiment of the present disclosure. This is not explained in each of subsequent embodiments.

In the relevant art, upon manufacturing of an array substrate, usually in the GOA product periphery wiring design, a signal line (VSS) is placed between the GOA and a pixel area. But after a gate layer is completed and upon manufacturing of an active layer, this easily results in same-layer electrostatic breakdown occurring between a gate line and the signal line.

Figure 1:
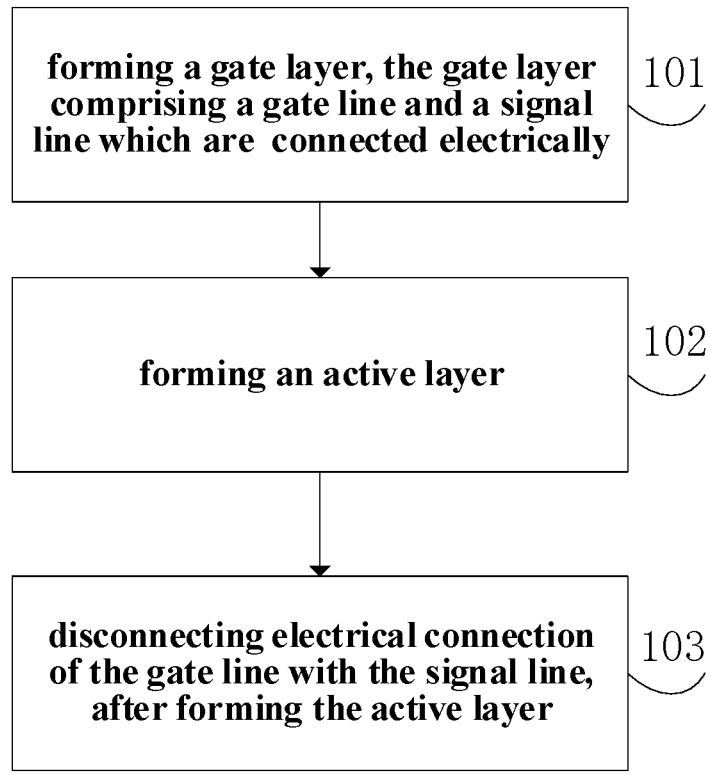
FIG. 1 is a flow diagram of an array substrate manufacturing method provided according to some embodiments of the present disclosure.

An array substrate manufacturing method provided according to some embodiments of the present disclosure can prevent the active layer from electrostatic breakdown upon its manufacturing. FIG. 1 shows a flow diagram of an array substrate manufacturing method provided according to some embodiments of the present disclosure. As shown in FIG. 1, the array substrate manufacturing method includes:

step 101: forming a gate layer, the gate layer comprising a gate line and a signal line which are connected electrically;

step 102: forming an active layer;

step 103: disconnecting the electrical connection of the gate line with the signal line after forming the active layer.

Usually in the GOA product periphery wiring design, the signal line is placed between the GOA and the pixel area, a Vgl voltage (a low level voltage) is loaded by controlling a GOA transistor. But after the gate layer is completed and upon manufacturing of the active layer, since both the gate line and the signal line are relatively long, charges are prone to accumulate on the gate line and the signal line, and these accumulated charges can not be released in time. When the gate line and the signal line are arranged to be close to each other, this easily results in same-layer electrostatic breakdown occurring between the gate line and the signal line, burns a gate insulation layer, thereby a short circuit connection with a metal wire of another layer is formed.

By adopting the array substrate manufacturing method provided according to the above mentioned embodiment, i.e. upon manufacturing of the gate layer, connecting the gate line with the reference signal line electrically, and after manufacturing of the active layer is completed, disconnecting the electrical connection, upon manufacturing of the active layer, electrostatic charges on the gate line and the signal line can be distributed evenly, the gate line and the signal line are substantially kept at a same potential, this avoids the problem of same-layer electrostatic breakdown occurring between the gate line and the periphery wiring, and does not influence a final product design function.

Figure 2:
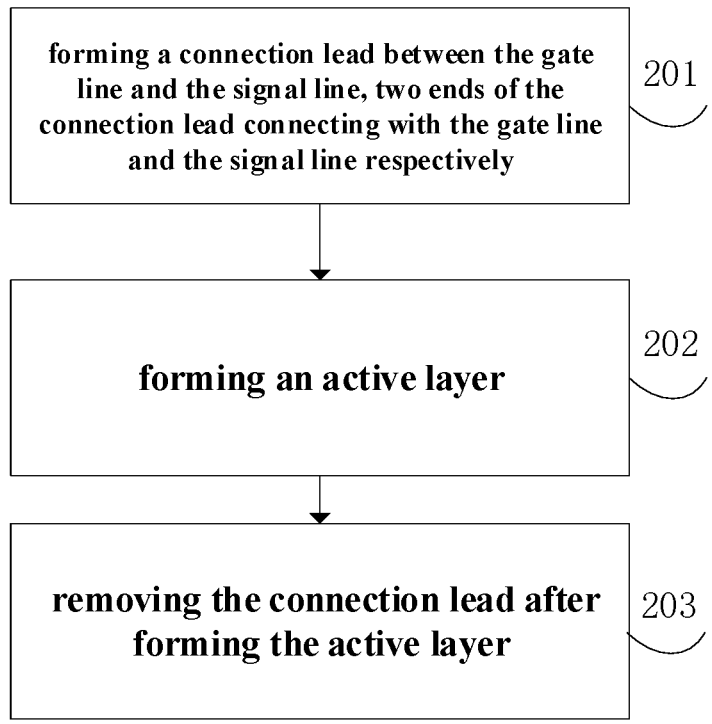
FIG. 2 is a flow diagram of an array substrate manufacturing method provided according to some other embodiments of the present disclosure.
Figure 6A:
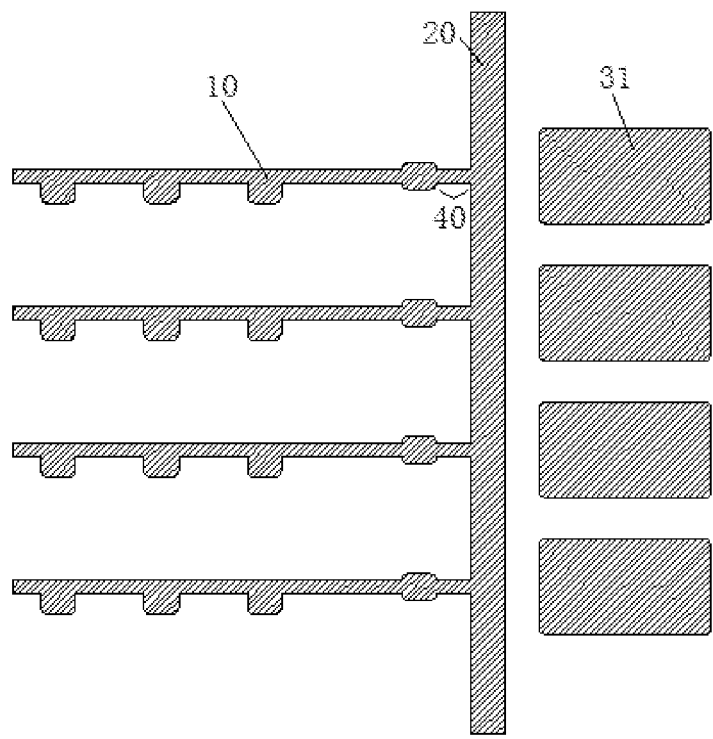
FIG. 6a is a top structural diagram of an array substrate after a connection lead is formed, in an array substrate manufacturing method provided according to some embodiments of the present disclosure.
Figure 6B:
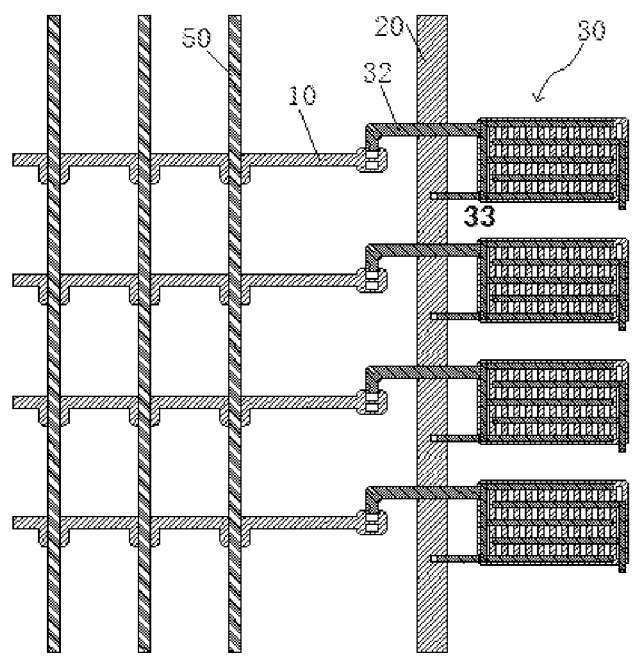
FIG. 6b is a top structural diagram of an array substrate after manufacturing of an array substrate is completed, in an array substrate manufacturing method provided according to some embodiments of the present disclosure.

An array substrate manufacturing method provided according to some other embodiments of the present disclosure can prevent the active layer from electrostatic breakdown upon its manufacturing. FIG. 2 is a flow diagram of an array substrate manufacturing method provided according to some other embodiments of the present disclosure. With reference to FIG. 2 and in conjunction with FIGS. 6a and 6b, the array substrate manufacturing method includes:

step 201: as shown in FIG. 6a, forming a connection lead 40 between the gate line 10 and the signal line 20. Two ends of the connection lead 40 connect with the gate line 10 and the signal line 20 respectively. In some embodiments, upon manufacturing of the gate layer, the gate line 10 and the connection lead 40 are manufactured simultaneously, this can save the manufacture process, improve the production efficiency. In some embodiments, upon manufacturing of the gate layer, a part of a wiring layer 31 in a GOA unit 30 may also be manufactured simultaneously.

step 202: forming an active layer.

step 203: removing the connection lead 40 after forming the active layer;

thereafter, continuing to complete manufacturing of other layers to obtain a structural diagram of a final array substrate, as shown in FIG. 6b. In FIG. 6a, the array substrate includes the gate line 10, a data wire 50, the signal line 20 and the GOA unit 30. The GOA unit 30 connects with the gate line 10 via a first connection wire 32 through a via, and connects with the signal line 20 via a second connection wire 33 through a via.

According to the array substrate manufacturing method provided by the above mentioned embodiment of the present disclosure, i.e. upon manufacturing of the gate layer, forming the connection lead between the gate line and the signal line, so as to connect the gate line with the signal line electrically through the connection lead, and after manufacturing of the active layer is completed, removing the connection lead, upon manufacturing of the active layer, the gate line and the signal line are kept at the same potential, this avoids the problem of same-layer electrostatic breakdown occurring between the gate line and the periphery wiring, and does not influence the final product design function. And, by completing the electrical connection of the gate line with the signal line through the connection lead, in the manufacture process, the electrical connection and disconnection of the gate line with the signal line can be achieved relatively conveniently.

Figure 3:
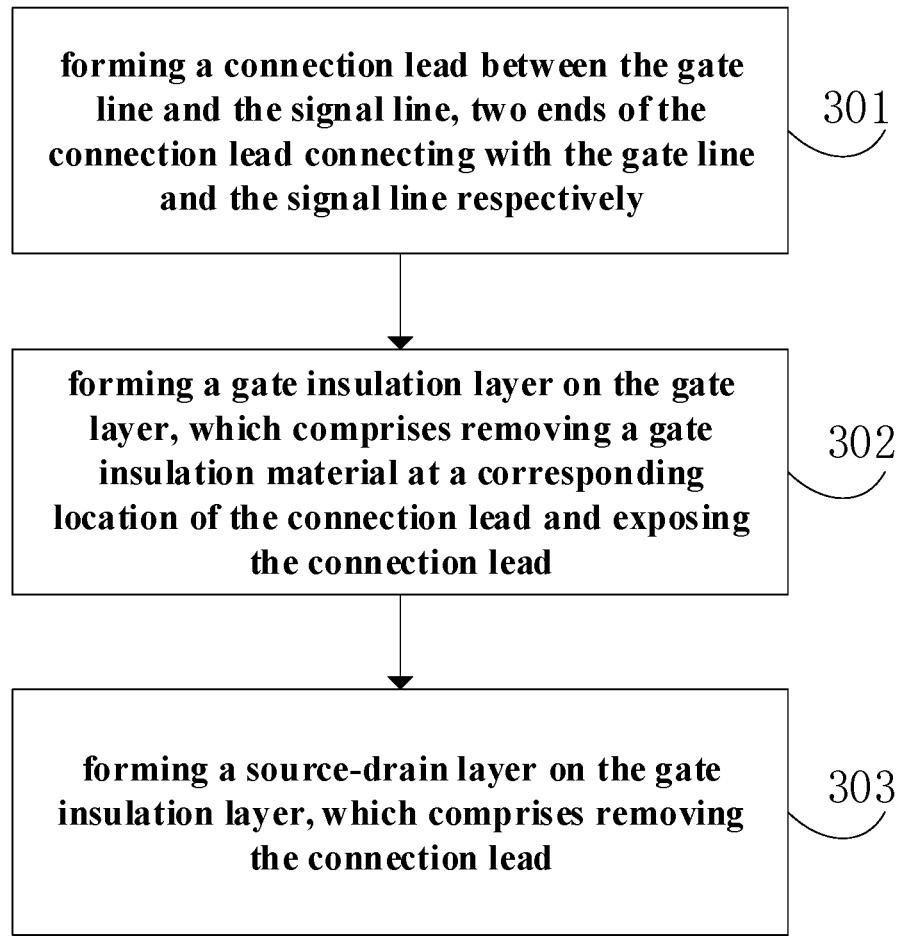
FIG. 3 is a flow diagram of an array substrate manufacturing method provided according to some yet other embodiments of the present disclosure.

An array substrate manufacturing method provided according to some yet other embodiments of the present disclosure can prevent the active layer from electrostatic breakdown upon its manufacturing. FIG. 3 is a flow diagram of an array substrate manufacturing method provided according to some yet other embodiments of the present disclosure.

Figure 7A:
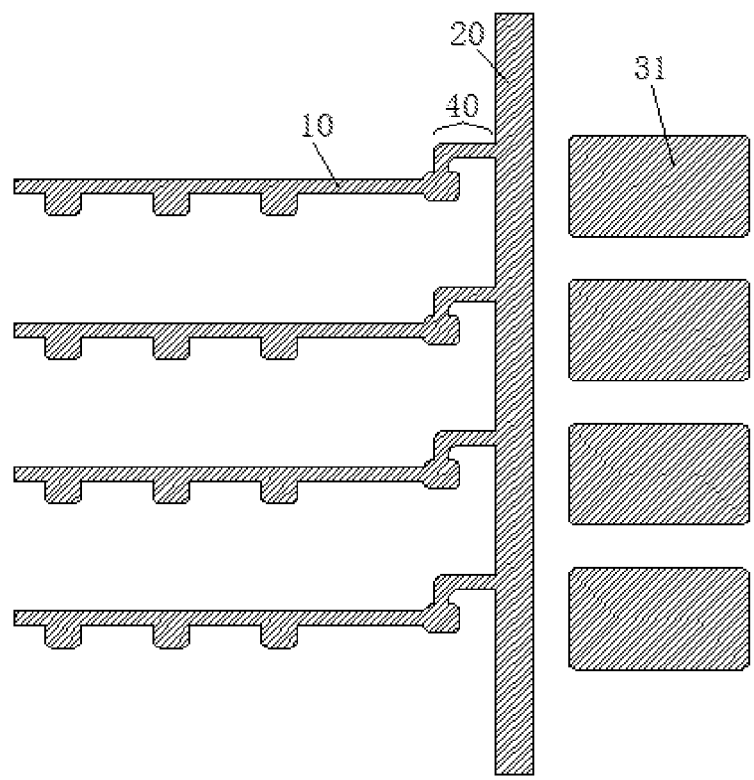
FIG. 7a is a top structural diagram of an array substrate after a connection lead is formed, in an array substrate manufacturing method provided according to some other embodiments of the present disclosure.
Figure 7B:
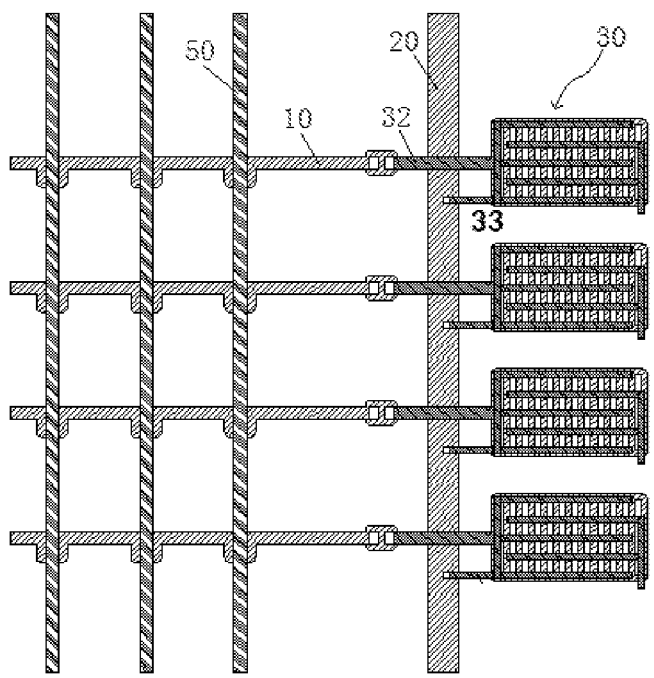
FIG. 7b is a top structural diagram of an array substrate after manufacturing of an array substrate is completed, in an array substrate manufacturing method provided according to some other embodiments of the present disclosure.

With reference to FIG. 3 and in conjunction with FIGS. 7a and 7b, the array substrate manufacturing method includes:

step 301: as shown in FIG. 7a, forming the connection lead 40 between the gate line 10 and the signal line 20, two ends of the connection lead 40 connecting with the gate line 10 and the signal line 20 respectively. In some embodiments, upon manufacturing of the gate layer, the gate line 10 and the connection lead 40 are manufactured simultaneously, this can save the manufacture process, improve the production efficiency.

step 302: forming a gate insulation layer, which comprises removing a gate insulation material at a corresponding location of the connection lead 40 and exposing the connection lead 40. This can use the manufacture process of the gate insulation layer and complete an exposure process of the connection lead simultaneously, thereby can simplify the manufacture process, improve the production efficiency.

step 303: forming a source-drain layer, which comprises disconnecting the connection lead 40. This can use the manufacture process of the source-drain layer and complete removal of the connection lead simultaneously, thereby can simplify the manufacture process, improve the production efficiency.

According to the array substrate manufacturing method provided by the above mentioned embodiment of the present disclosure, i.e. upon manufacturing of the gate layer, connecting the gate line with the signal line electrically, and after manufacturing of the active layer is completed, disconnecting the electrical connection, upon manufacturing of the active layer, the gate line and the signal line are kept at the same potential, this avoids the problem of same-layer electrostatic breakdown occurring between the gate line and the periphery wiring, and does not influence the final product design function.

In some embodiments, the connection lead 40 bypasses a subsequently manufactured connection path between a gate drive circuit and the gate line 10. This avoids an influence on a subsequent connection process between the gate drive circuit and the gate line. In the present disclosure, any connection means which can achieve the connection between the gate drive circuit and the gate line 10 may be called the connection path. In some embodiments, the connection path between the gate drive circuit and the gate line 10 is a linear connection path. Those skilled in the art may understand that, the connection path between the gate drive circuit and the gate line 10 may be of any shape.

In some embodiments, with reference to FIG. 7a, the shape of the connection lead 40 is an L shape, and two ends of the connection lead 40 connect with the gate line 10 and the signal line 20 respectively; in this way, upon subsequent manufacturing of the source-drain layer, after the connection lead 40 is removed, a trace left on the array substrate is not located on the shortest path (i.e. the horizontal path in FIG. 7b) between the gate line 10 and the GOA unit 30, so that the gate line 10 and the GOA unit 30 may be connected through a linear first connection wire 32, this is unlike FIG. 6b in which a bending shape is utilized to bypass the trace (usually a recess) left on the array substrate when the connection lead 40 is removed. In this way, the subsequent connection process between the gate line 10 and the GOA unit 30 is caused to be operated and achieved more easily. Those skilled in the art may understand that, the shape of the connection lead may be any other shape.

Figure 4:
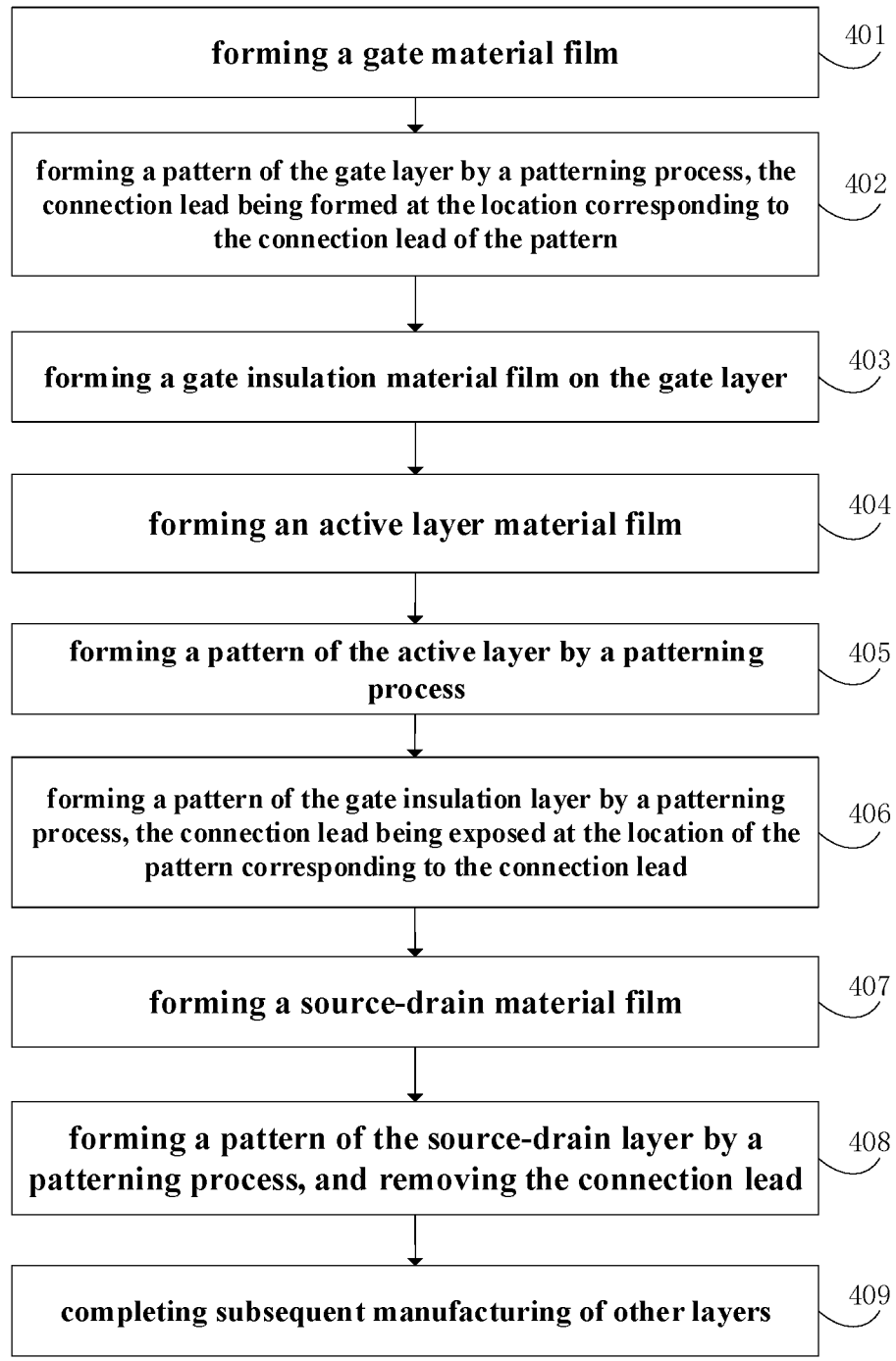
FIG. 4 is a flow diagram of an array substrate manufacturing method provided according to some still yet other embodiments of the present disclosure.

An array substrate manufacturing method provided according to some still yet other embodiments of the present disclosure can prevent the active layer from electrostatic breakdown upon its manufacturing. FIG. 4 is a flow diagram of an array substrate manufacturing method provided according to some still yet other embodiments of the present disclosure. As shown in FIG. 4, the array substrate manufacturing method includes:

step 401: forming a gate material film;

step 402: forming a pattern of the gate layer by a patterning process, the pattern including the gate line (e.g., the gate line 10 in FIGS. 6a-7b), the pattern including the connection lead (e.g., the connection lead 40 in FIG. 6a or 7a); sometimes, upon manufacturing of the gate layer, usually a common electrode or a common electrode wire is also manufactured simultaneously, and in some embodiments, according to a specific process or structure change, it is also possible to form a common electrode pattern while the gate layer is formed;

step 403: forming a gate insulation material film on the gate layer;

step 404: forming an active layer material film;

step 405: forming a pattern of the active layer by a patterning process;

step 406: forming a pattern of the gate insulation layer by a patterning process, the connection lead being exposed at a location corresponding to the connection lead in the pattern of the gate insulation layer;

Here, after the gate insulation material film is manufactured and formed, the active layer material film is subsequently formed to complete manufacturing of the active layer, then manufacturing of the gate insulation layer is completed, so that the gate insulation material film can be used to perform corresponding insulation protection on the formed pattern on the substrate;

step 407: forming a source-drain material film;

step 408: forming a pattern of the source-drain layer by a patterning process, and removing the connection lead;

step 409: completing subsequent manufacturing of other layers.

In some embodiments, steps of forming respective material films may be implemented by adopting one of processes such as deposition, coating, sputtering, etc, may also be implemented by adopting different processes when different films are formed, specific implementations may be selected according to actual needs.

In some embodiments, in steps of forming the gate layer, the active layer, the gate insulation layer, the source-drain layer, etc, by a patterning process, the patterning process may be understood in such a way that a process may be called the patterning process as long as it may form the needed pattern. In some embodiments, the patterning process may use a mask to form a corresponding pattern, may specifically include a process such as photoresist application, exposure, development, etch, photoresist stripping, etc. Sometimes, a traditional process which uses a mask may also not be adopted, a needed pattern may also be manufactured, such as by using a lift-off technology. In addition, there are also other cases of patterning without using a mask, for example, it is possible to adopt more other patterning methods such as printing, etc.

According to the array substrate manufacturing method provided by the above mentioned embodiment of the present disclosure, i.e. upon manufacturing of the gate layer, connecting the gate line with the signal line electrically, and after manufacturing of the active layer is completed, disconnecting the electrical connection, upon manufacturing of the active layer, the gate line and the signal line are kept at the same potential, thereby this reduces or avoids a potential difference generated by charge accumulation occurring on the gate line and the signal line in the process of manufacturing the active layer, eventually avoids the problem of same-layer electrostatic breakdown occurring between the gate line and the periphery wiring, and does not influence the final product design function.

Figure 5:
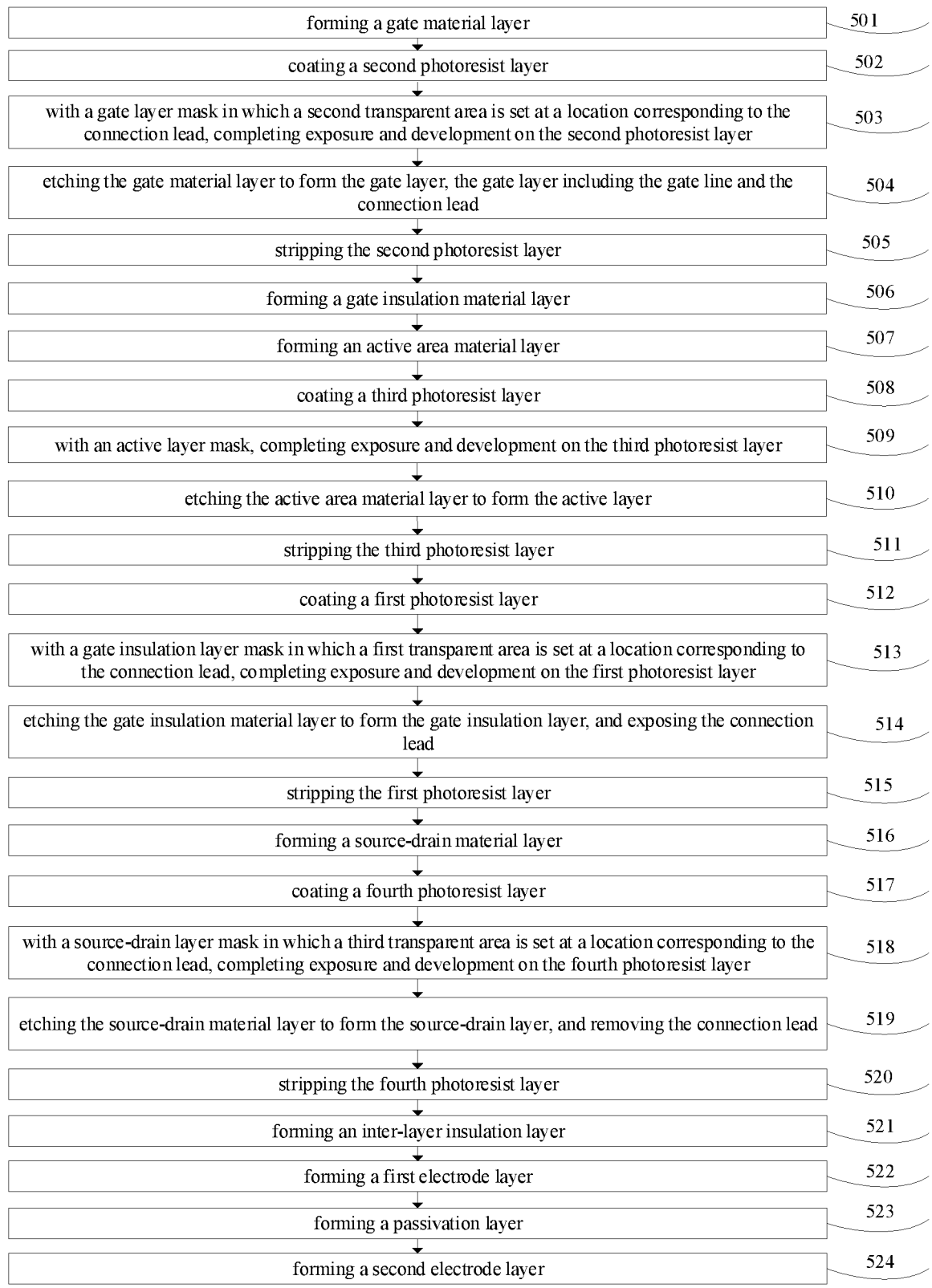
FIG. 5 is a flow diagram of an array substrate manufacturing method provided according to some still yet other embodiments of the present disclosure.

An array substrate manufacturing method provided according to some yet other embodiments of the present disclosure can prevent the active layer from electrostatic breakdown upon its manufacturing. FIG. 5 is a flow diagram of an array substrate manufacturing method provided according to some still yet other embodiments of the present disclosure. As shown in FIG. 5, the array substrate manufacturing method includes:

step 501: forming a gate material layer; in some embodiments, the gate material layer may be formed by adopting a deposition method;

step 502: coating a second photoresist layer;

step 503: with a gate layer mask in which a second transparent area is set at a location corresponding to the connection lead (e.g. the connection lead 40 in FIG. 6a or FIG. 7a), completing exposure and development on the second photoresist layer;

step 504: etching the gate material layer to form the gate layer, the gate layer including the gate line and the connection lead;

step 505: stripping the second photoresist layer;

step 506: forming a gate insulation material layer; in some embodiments, the gate insulation material layer may be formed by adopting a deposition method;

step 507: forming an active layer material layer; in some embodiments, the active layer material layer may be formed by adopting a deposition method;

step 508: coating a third photoresist layer;

step 509: with an active layer mask, completing exposure and development on the third photoresist layer;

step 510: etching the active layer material layer to form the active layer;

step 511: stripping the third photoresist layer;

step 512: coating a first photoresist layer;

step 513: with a gate insulation layer mask in which a first transparent area is set at a location corresponding to the connection lead, completing exposure and development on the first photoresist layer;

step 514: etching the gate insulation material layer to form the gate insulation layer, and exposing the connection lead;

step 515: stripping the first photoresist layer;

step 516: forming a source-drain material layer; in some embodiments, the source-drain material layer may be formed by adopting a deposition method;

step 517: coating a fourth photoresist layer;

step 518: with a source-drain layer mask in which a third transparent area is set at a location corresponding to the connection lead, completing exposure and development on the fourth photoresist layer;

step 519: etching the source-drain material layer to form the source-drain layer, and removing the connection lead;

step 520: stripping the fourth photoresist layer;

step 521: forming an inter-layer insulation layer (PVX1); in some embodiments, the inter-layer insulation layer may be formed by adopting processes such as deposition, coating, sputtering, etc;

step 522: forming a first electrode layer (ITO1); in some embodiments, the first electrode layer may be formed by a patterning process;

step 523: forming a passivation layer (PVX2); in some embodiments, the passivation layer may be formed by adopting processes such as deposition, coating, sputtering, etc;

step 524: forming a second electrode layer (ITO2); in some embodiments, the second electrode layer may be formed by a patterning process.

According to the array substrate manufacturing method provided by the above mentioned embodiment of the present disclosure, i.e. upon manufacturing of the gate layer, connecting the gate line with the signal line electrically, and after manufacturing of the active layer is completed, disconnecting the electrical connection, upon manufacturing of the active layer, the gate line and the signal line are kept at the same potential, thereby this reduces or avoids a potential difference generated by charge accumulation occurring on the gate line and the signal line in the process of manufacturing the active layer, eventually avoids the problem of same-layer electrostatic breakdown occurring between the gate line and the periphery wiring, and does not influence the final product design function.

Meanwhile, by using the gate layer mask in which the second transparent area is set at the location corresponding to the connection lead, exposure and development on the second photoresist layer are completed, so that the connection lead is formed while forming the gate layer; by using the gate insulation layer mask in which the first transparent area is set at the location corresponding to the connection lead, completing exposure and development on the first photoresist layer, so that the connection lead is exposed while forming the gate insulation layer; and, by using the source-drain layer mask in which the third transparent area is set at the location corresponding to the connection lead, completing exposure and development on the fourth photoresist layer, so that the connection lead is removed while forming the source-drain; in this way, the connection lead is formed simultaneously by using the manufacture process of the gate layer, the exposure process of the connection lead is completed simultaneously by using the manufacture process of the gate insulation layer, and removal of the connection lead is completed simultaneously by using the manufacture process of the source-drain layer, this can simplify the manufacture process greatly, improve the production efficiency effectively.

According to the array substrate provided by the embodiment of the present disclosure, i.e. the array substrate which is manufactured by adopting any array substrate manufacturing method as described above, e.g. the array substrate shown in FIG. 6b or FIG. 7b, by, upon manufacturing of the gate layer, connecting the gate line with the signal line electrically; after manufacturing of the active layer is completed, disconnecting the electrical connection, upon manufacturing of the active layer, electrostatic charges on the gate line and the signal line can be distributed evenly, the gate line and the signal line are substantially kept at the same potential, this avoids the problem of same-layer electrostatic breakdown occurring between the gate line and the periphery wiring, and does not influence a final product design function.

Figure 8:
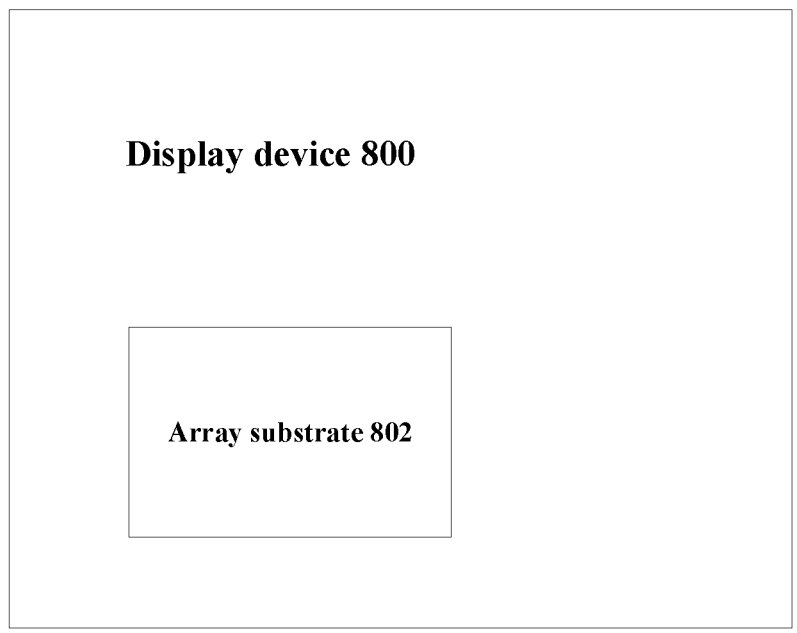
FIG. 8 is a structural diagram of a display device provided according to some embodiments of the present disclosure.

FIG. 8 is a structural diagram of a display device 800 provided according to some embodiments of the present disclosure. The display device 800 includes an array substrate 802, e.g. the array substrate shown in FIG. 6b or FIG. 7b.

According to the display device provided by the embodiment of the present disclosure, by, upon manufacturing of the gate layer, connecting the gate line with the signal line electrically; after manufacturing of the active layer is completed, disconnecting the electrical connection, upon manufacturing of the active layer, electrostatic charges on the gate line and the signal line can be distributed evenly, the gate line and the signal line are substantially kept at the same potential, this avoids the problem of same-layer electrostatic breakdown occurring between the gate line and the periphery wiring, and does not influence a final product design function.

It is to be noted that, the display device in the present embodiment may be any product or component, such as electronic paper, a cellphone, a tablet computer, a TV set, a notebook computer, a digital photo frame, a navigator, which has a display function.

Those ordinary skilled in the art should understand: the above are only specific embodiments of the present disclosure, and are not used to limit the present disclosure. Any modifications, equivalent substitutions, improvements, etc, made within the spirit and principle of the present disclosure are to be contained within the protection scope of the present disclosure.

What is claimed is:

1. An array substrate manufacturing method comprising:
   forming a gate layer, the gate layer comprises a gate line and a signal line which are connected electrically, wherein forming the gate layer comprises: forming a connection lead between the gate line and the signal line, two ends of the connection lead connect with the gate line and the signal line respectively;
   forming a gate insulation layer on the gate layer, wherein forming the gate insulation layer on the gate layer comprises forming a gate insulation material film on the gate layer; and forming the gate insulation layer by patterning the gate insulation material film and exposing the connection lead;
   forming an active layer; and
   forming a source-drain layer on the gate insulation layer after forming the active layer, wherein forming the source-drain layer on the gate insulation layer comprises removing the connection lead.

2. The array substrate manufacturing method according to claim 1, wherein forming the gate layer comprises forming the gate line and the connection lead simultaneously.

3. The array substrate manufacturing method according to claim 1, wherein before forming the gate insulation material film, the method further comprises:
   forming a gate material film; and
   forming the gate layer by patterning the gate material film, the gate layer including the connection lead.

4. The array substrate manufacturing method according to claim 3, wherein after forming the gate layer by the patterning process, the method further comprises:
   forming an active layer material film; and
   forming the active layer by patterning the active layer material film.

5. The array substrate manufacturing method according to claim 1, wherein forming the source-drain layer on the gate insulation layer comprises:
   forming a source-drain material film; and
   forming the source-drain layer by patterning the source-drain material film, and removing the connection lead.

6. The array substrate manufacturing method according to claim 5, wherein after forming the source-drain layer, the method further comprises:
   forming an inter-layer insulation layer;
   forming a first electrode layer;
   forming a passivation layer; and
   forming a second electrode layer.

7. The array substrate manufacturing method according to claim 1, wherein a connection path is formed between a gate drive circuit and the gate line after removing of the connection lead, wherein the connection path does not overlap an area of the removed connection lead.

8. The array substrate manufacturing method according to claim 7, wherein the connection path is a linear connection path.

9. The array substrate manufacturing method according to claim 7, wherein the connection path is an L-shape connection path.

* * * * *